United States Patent
Lin et al.

(10) Patent No.: US 11,670,154 B2
(45) Date of Patent: Jun. 6, 2023

(54) SYSTEM AND METHOD FOR CONTROLLING SEMICONDUCTOR MANUFACTURING APPARATUS

(71) Applicant: NANYA TECHNOLOGY CORPORATION, New Taipei (TW)

(72) Inventors: Tso-Hsin Lin, Taoyuan (TW); Chung-Heng Chen, New Taipei (TW); Jun-De Lee, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 340 days.

(21) Appl. No.: 17/064,365

(22) Filed: Oct. 6, 2020

(65) Prior Publication Data
US 2022/0108597 A1    Apr. 7, 2022

(51) Int. Cl.
*G08B 21/18* (2006.01)
*G05B 19/4065* (2006.01)
*H01L 21/683* (2006.01)

(52) U.S. Cl.
CPC ....... *G08B 21/187* (2013.01); *G05B 19/4065* (2013.01); *H01L 21/6833* (2013.01); *G05B 2219/34427* (2013.01)

(58) Field of Classification Search
CPC ...... G05B 19/4065; G05B 2219/34427; G08B 21/187
See application file for complete search history.

(56) References Cited

U.S. PATENT DOCUMENTS

| | | | |
|---|---|---|---|
| 7,702,413 B2 * | 4/2010 | Ushiku | G05B 19/41885 438/770 |
| 2005/0004774 A1 * | 1/2005 | Volk | G06T 7/0008 702/108 |
| 2007/0067678 A1 * | 3/2007 | Hosek | G05B 23/0235 714/25 |
| 2015/0346717 A1 | 12/2015 | Hosek et al. | |
| 2016/0056064 A1 * | 2/2016 | Miki | H01L 21/67288 702/182 |

FOREIGN PATENT DOCUMENTS

| TW | I385703 B | 2/2013 |
|---|---|---|
| TW | I390594 B | 3/2013 |

* cited by examiner

*Primary Examiner* — Mirza F Alam
(74) *Attorney, Agent, or Firm* — Muncy, Geissler, Olds & Lowe, P.C.

(57) ABSTRACT

The present disclosure provides systems and methods for controlling a semiconductor manufacturing apparatus. A control system includes an inspection unit capturing a set of images of the semiconductor manufacturing apparatus, a sensor interface receiving the set of images and generating at least one input signal for a database server, and a control unit. The control unit includes a front end subsystem, a calculation subsystem, and a message and feedback subsystem. The calculation subsystem receives the data signal from the front end subsystem, wherein the calculation subsystem performs an artificial intelligence analytical process to determine, according to the data signal, whether a malfunction has occurred in the semiconductor manufacturing apparatus and to generate an output signal. The message and feedback subsystem generates an alert signal and a feedback signal according to the output signal, and the alert signal is transmitted to a user of the semiconductor manufacturing apparatus.

17 Claims, 21 Drawing Sheets

SYSTEM AND METHOD FOR CONTROLLING SEMICONDUCTOR MANUFACTURING APPARATUS

TECHNICAL FIELD

The present disclosure relates to a system and a method for controlling an apparatus, and more particularly, to a system and a method for controlling a semiconductor manufacturing apparatus.

DISCUSSION OF THE BACKGROUND

The rapid growth of the semiconductor industry has been attributed to the improvement of integration density. In many fabrication tools, semiconductor manufacturing apparatus such as transfer robots form an indispensable part of the fabrication process. A malfunction or path deviation of these transfer robots is often discovered after a large quantity of wafers have already been damaged and scrapped. Human inspection and monitoring of the transfer robots result in lost processing time and defective products due to human error. Accordingly, systems and methods for controlling and monitoring the status of the transfer robots need to be effective in finding the faulty apparatus, as well as providing advanced warnings of various apparatus parameters.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a control system of a semiconductor manufacturing apparatus, comprising an inspection unit capturing a set of images of the semiconductor manufacturing apparatus, a sensor interface receiving the set of images and generating at least one input signal for a database server, and a control unit. The control unit comprises a front end subsystem, a calculation subsystem, and a message and feedback subsystem. The front end subsystem receives the at least one input signal from the database server and performs a front end process to generate a data signal. The calculation subsystem receives the data signal from the front end subsystem, wherein the calculation subsystem performs an artificial intelligence (AI) analytical process to determine, according to the data signal, whether a malfunction has occurred in the semiconductor manufacturing apparatus and to generate an output signal. The message and feedback subsystem generates an alert signal and a feedback signal according to the output signal, the message and feedback subsystem transmitting the alert signal to a user of the semiconductor manufacturing apparatus.

In some embodiments, the front end process performed by the front end subsystem comprises extracting, transforming, and/or loading the input signal from the database server.

In some embodiments, the AI analytical process performed by the calculation subsystem compares a transport path of the semiconductor manufacturing apparatus to a predetermined path.

In some embodiments, the AI analytical process performed by the calculation subsystem further utilizes an object tracking algorithm to track the semiconductor manufacturing apparatus and identify one or more images in the data signal in which the transport path of the semiconductor manufacturing apparatus deviates from the predetermined path.

In some embodiments, the AI analytical process performed by the calculation subsystem further utilizes a statistical model prediction to obtain a likelihood score of the semiconductor manufacturing apparatus corresponding to the images of the data signal.

In some embodiments, the message and feedback subsystem transmits the feedback signal for an automated feedback process of the semiconductor manufacturing apparatus according to the output signal.

In some embodiments, the semiconductor manufacturing apparatus comprises one or more transfer robots.

Another aspect of the present disclosure provides a control system of a semiconductor manufacturing apparatus comprising an inspection unit capturing a set of images of the semiconductor manufacturing apparatus, a sensor interface receiving the set of images and generating at least one input signal for a database server, one or more processors, and one or more computer-readable non-transitory storage media. The one or more computer-readable non-transitory storage media is coupled to the one or more processors and includes instructions operable when executed by the one or more processors to cause the control system to: receive the at least one input signal from the database server and perform a front end process to generate a data signal; perform an artificial intelligence (AI) analytical process to determine, according to the data signal, whether a malfunction has occurred in the semiconductor manufacturing apparatus and to generate an output signal; and generate an alert signal and a feedback signal according to the output signal, and transmit the alert signal to a user of the semiconductor manufacturing apparatus.

In some embodiments, the front end process comprises extracting, transforming, and/or loading the input signal from the database server.

In some embodiments, the one or more computer-readable non-transitory storage media further comprises instructions operable when executed by the one or more processors to cause the control system to perform the AI analytical process by comparing a transport path of the semiconductor manufacturing apparatus to a predetermined path.

In some embodiments, the one or more computer-readable non-transitory storage media further comprising instructions operable when executed by the one or more processors to cause the control system to perform the AI analytical process by further utilizing an object tracking algorithm to track the semiconductor manufacturing apparatus and identify one or more images in the data signal in which the transport path of the semiconductor manufacturing apparatus deviates from the predetermined path.

In some embodiments, the one or more computer-readable non-transitory storage media further comprises instructions operable when executed by the one or more processors to cause the control system to perform the AI analytical process by further utilizing a statistical model prediction to obtain a likelihood score of the semiconductor manufacturing apparatus corresponding to the images of the data signal.

In some embodiments, the one or more computer-readable non-transitory storage media further comprises instructions operable when executed by the one or more processors to cause the control system to transmit the feedback signal for an automated feedback process of the semiconductor manufacturing apparatus according to the output signal.

In some embodiments, the semiconductor manufacturing apparatus comprises one or more transfer robots.

Another aspect of the present disclosure provides a method for controlling a semiconductor manufacturing apparatus comprising: capturing, by an inspection unit, a set of images of the semiconductor manufacturing apparatus; receiving, by a sensor interface, the set of images and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether a malfunction has occurred in the semiconductor manufacturing apparatus and to generate an output signal; and generating, by a message and feedback subsystem, an alert signal and a feedback signal according to the output signal, the message and feedback subsystem transmitting the alert signal to a user of the semiconductor manufacturing apparatus.

In some embodiments, the front end process performed by the front end subsystem further comprising extracting, transforming, and/or loading the input signal from the database server.

In some embodiments, the AI analytical process performed by the calculation subsystem further comprises comparing a transport path of the semiconductor manufacturing apparatus to a predetermined path.

In some embodiments, the AI analytical process performed by the calculation subsystem further comprises utilizing an object tracking algorithm to track the semiconductor manufacturing apparatus and identify one or more images in the data signal in which the transport path of the semiconductor manufacturing apparatus deviates from the predetermined path.

In some embodiments, the AI analytical process performed by the calculation subsystem further comprises utilizing a statistical model prediction to obtain a likelihood score of the semiconductor manufacturing apparatus corresponding to the images of the data signal.

In some embodiments, the method further comprises transmitting, by the message and feedback subsystem, the feedback signal for an automated feedback process of the semiconductor manufacturing apparatus according to the output signal, wherein the semiconductor manufacturing apparatus comprises one or more transfer robots.

Accordingly, the systems and methods for controlling the semiconductor manufacturing apparatus provide automated AI subsystems and processes capable of analyzing apparatus such as the transfer robot that may be deviating from a predetermined path. Due to the control unit, which includes the intelligent calculation subsystem and the message and feedback subsystem, operators of the transfer robot can monitor and optimize the process parameters and receive advanced warnings regarding malfunctioning apparatus. Moreover, due to the automated apparatus feedback of the control systems and methods, human judgment error, processing times, and the quantity of defective products can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
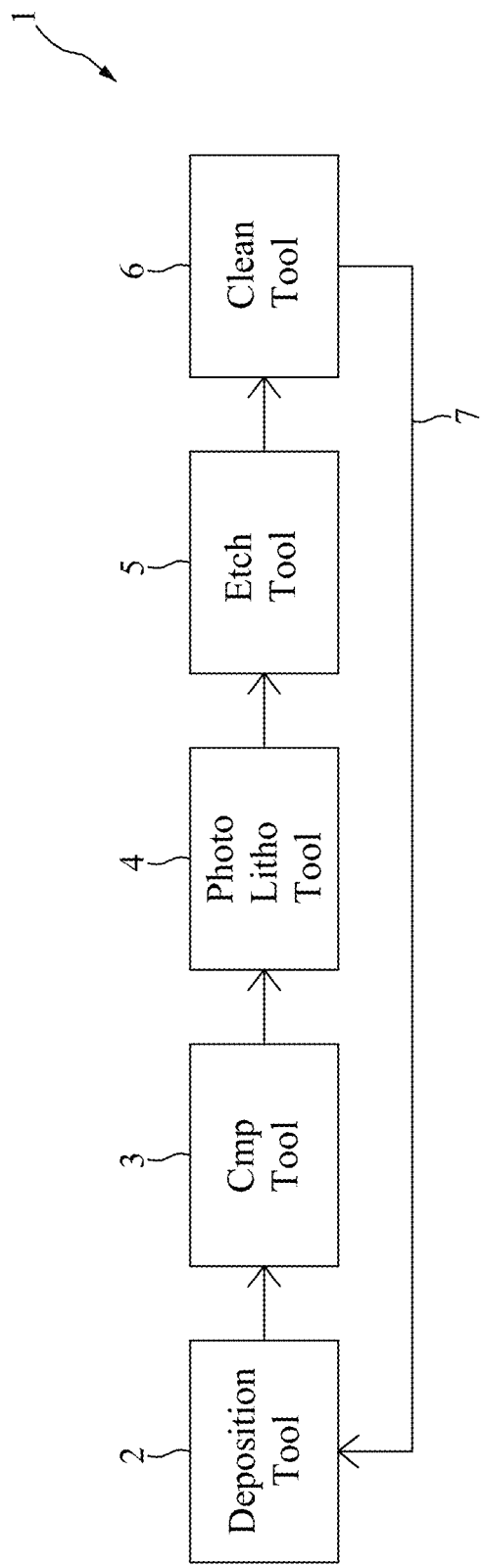
FIG. 1 is a block diagram of a semiconductor fabrication facility according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

To describe film-forming or deposition processes, the term "deposition" will generally be used herein for consistency. For film removal, the term "etch" will be used, and for a cleaning removal process, the term "clean" will be used. The figures may use other designations as applicable for illustrative clarity or convenience.

FIG. 1 is a block diagram of a semiconductor fabrication facility 1 according to some embodiments of the present disclosure. With reference to FIG. 1, the semiconductor fabrication facility 1 may include a plurality of semiconductor manufacturing apparatus such as a deposition tool 2, a chemical mechanical polishing (CMP) tool 3, a photolithography tool 4, an etch tool 5, and a clean tool. Typically, a design of microelectronic devices to be formed in a wafer is produced, and a layout is made from the design. The layout may include sets of patterns that will be transferred to one or more stacked layers of materials that are applied to the wafer during its fabrication in a process sequence 7 to form the various circuits and devices on the substrate of the wafer. According to some embodiments, the process sequence 7 of the semiconductor fabrication facility 1 shown in FIG. 1 is an exemplary process flow which may be used several times to deposit or form films on a substrate of the wafer and pattern them using a variety of lithography and etch techniques. Such general fabrication steps may include a deposition process using the deposition tool 2, a planarization and/or polishing process using the CMP tool 3, an exposure process with a patterned wavelength of light using the photolithography tool 4, a removal process of the exposed portions of the film using the etch tool 5, and a cleaning process using the clean tool 6 in preparation for subsequent processing. It should be noted that, more steps than deposition, planarization, photolithography, etch, and cleaning may be utilized in the semiconductor fabrication facility 1 as would be understood by a person of ordinary skill in the art. Moreover, each of the steps of a deposition, planarization, photolithography, etch, and clean process may include various specific steps. Therefore, the process sequence 7 depicted in FIG. 1 should not be construed as limiting with respect to embodiments of the present disclosure. In some embodiments, examples of the deposition techniques used in the deposition tool 2 may include chemical vapor deposition (CVD), electrochemical deposition (ECD), physical vapor deposition (PVD), molecular beam epitaxy (MBE), atomic layer deposition (ALD), self-assembled monolayer (SAM) deposition and others. In some embodiments, the deposition techniques may be complemented by the creation of plasma so as to suitably affect the chemical reactivity of the processes occurring at the substrate surface. It should be further noted that, in some embodiments, each of the fabrication tools 2-6 may include a semiconductor manufacturing apparatus such as one or more transfer robots, as described later in the present disclosure, that serve to transfer the wafer during the process sequence 7.

Figure 2:
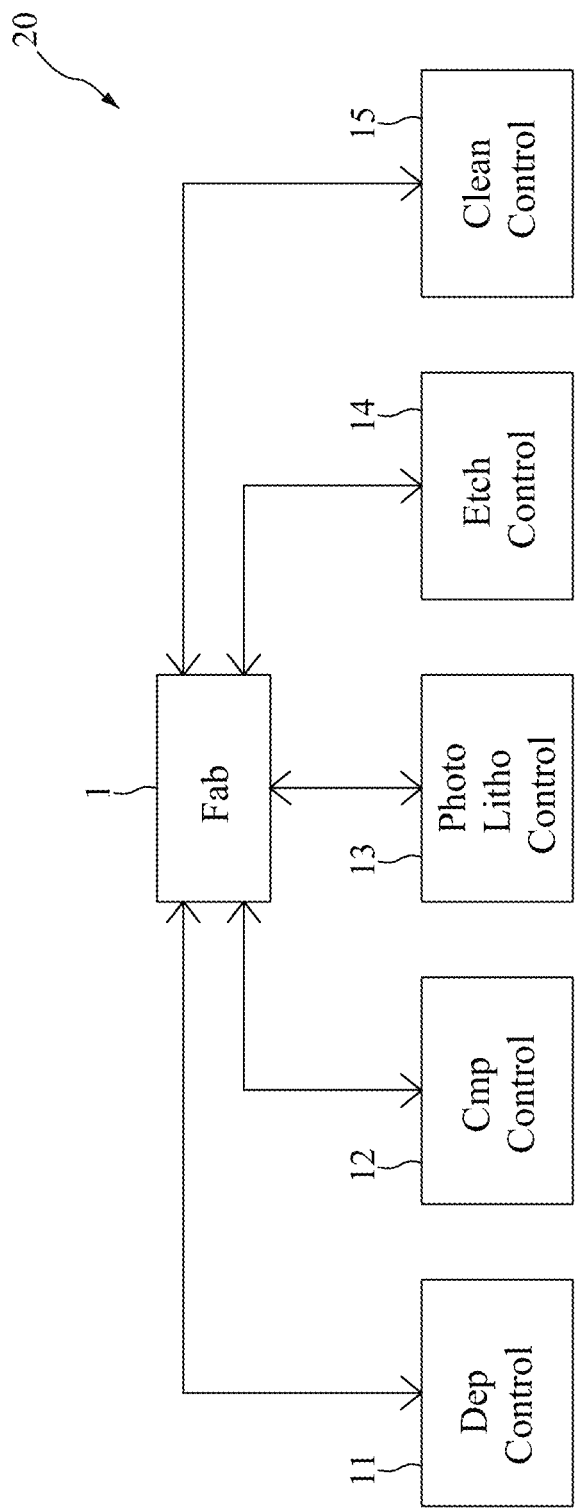
FIG. 2 is a block diagram of a control platform of a semiconductor fabrication facility according to some embodiments of the present disclosure.

FIG. 2 is a block diagram of a control platform 20 of the semiconductor fabrication facility 1 according to some embodiments of the present disclosure. With reference to FIG. 1 and FIG. 2, the control platform 20 includes a plurality of systems for controlling and monitoring the fabrication tools of the semiconductor fabrication facility 1. The control platform 20 may include a system 11 for controlling the deposition tool 2, a system 12 for controlling the CMP tool 3, a system 13 for controlling the photolithography tool 4, a system 14 for controlling the etch tool 5, and a system 15 for controlling the clean tool 6. In some embodiments, as described later in the present disclosure, the control systems 11-15 may include additional systems for monitoring the health of electrostatic chucks in the fabrication tools 2-6 of the semiconductor fabrication facility 1. Moreover, measurement or metrology data may be captured to control and optimize the fabrication processes performed by the fabrication tools of the semiconductor fabrication facility 1. For instance, the systems for monitoring and controlling the electrostatic chucks of the fabrication tools 2-6 may include a plurality of subsystems to control and monitor various parameters and settings in order to optimize the performance of the electrostatic chucks in the fabrication tools 2-6 of FIG. 1, as described later in embodiments of the present disclosure.

Figure 3:
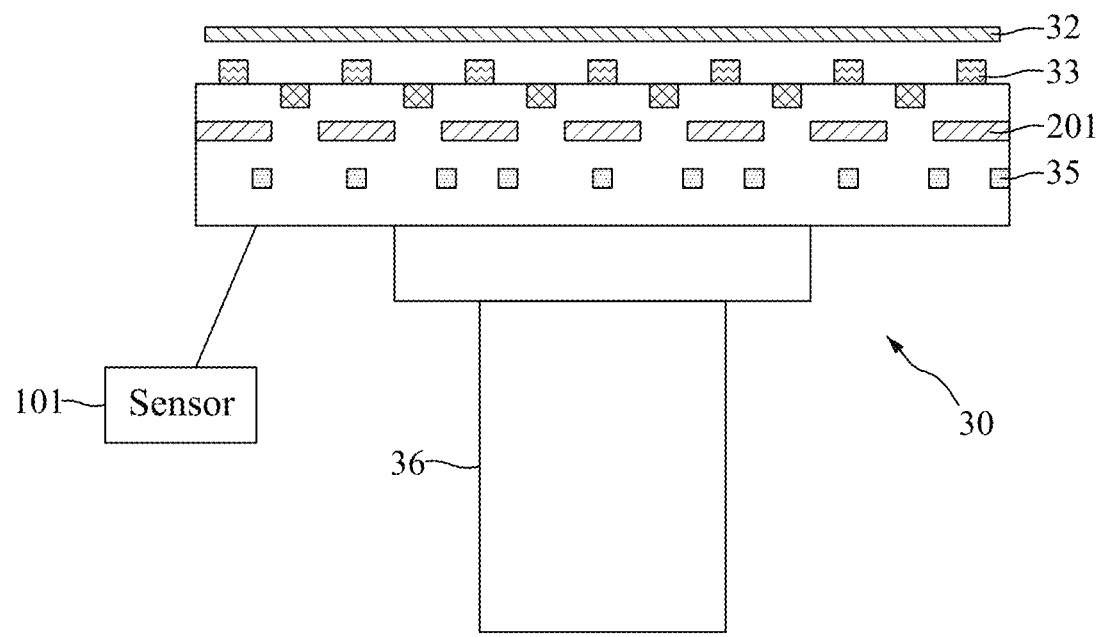
FIG. 3 is a schematic view of an electrostatic chuck according to some embodiments of the present disclosure.
Figure 4A:
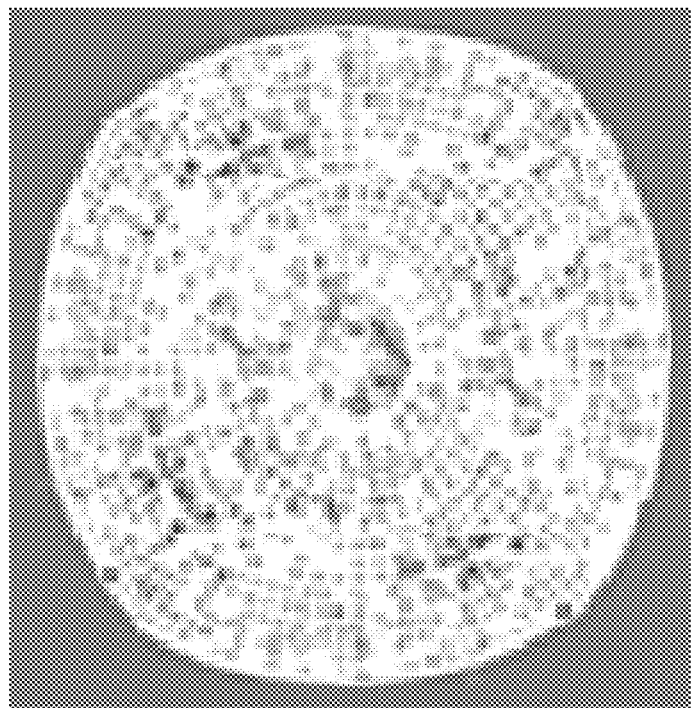
FIG. 4A and FIG. 4B are surface mappings of the electrostatic chuck in FIG. 3 according to some embodiments of the present disclosure
Figure 4B:
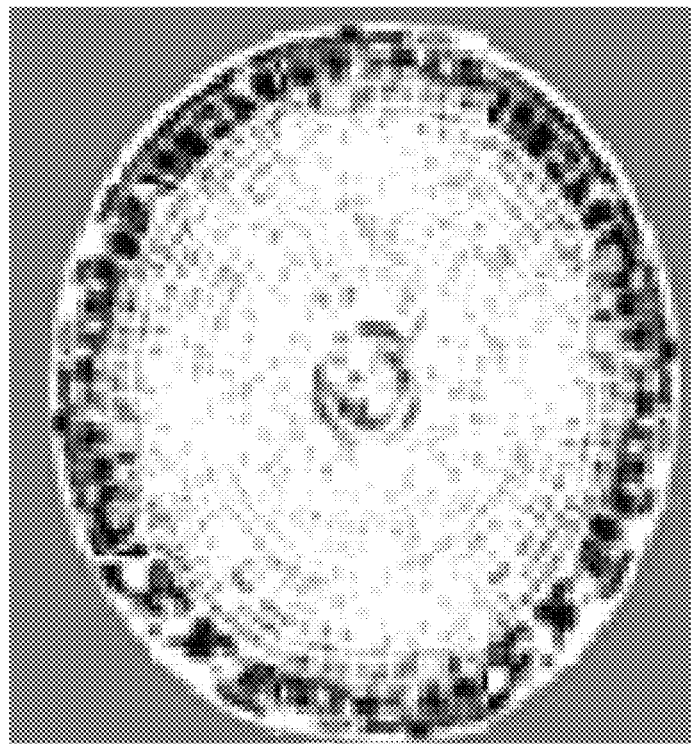

FIG. 3 is a schematic view of an electrostatic chuck 30 according to some embodiments of the present disclosure. FIG. 4A and FIG. 4B are surface mappings of the electrostatic chuck 30 according to some embodiments of the present disclosure. In some embodiments, the electrostatic chuck 30 may be installed in any of the fabrication tools 2-6 of the semiconductor fabrication facility 1 depicted in FIG. 1, or other fabrication tools which may include electrostatic chucks. The electrostatic chuck 30 may be a semiconductor manufacturing apparatus that may be used to in conjunction with a transfer robot (not shown) for handling a wafer 32 during semiconductor manufacturing processes of the fabrication tools 2-6, for example. With reference to FIG. 3, the electrostatic chuck 30 may include a plurality of dimples 33, one or more electrodes 34, a heating portion 35, and a pedestal section 36. In some embodiments, the electrostatic chuck 30 may hold or release the wafer 32 by manipulating electrostatic energy. For example, the wafer 32 may be suctioned to the electrostatic chuck 30 by applying a direct current (DC) voltage to the electrostatic chuck 30 through the pedestal section 36 so that half of a surface of the electrostatic chuck 30 is positive charged, while the other half is negative charged. Moreover, in some embodiments, an argon gas may be passed to the wafer 32 through the pedestal section 36 of the electrostatic chuck 30, so that thermo-distribution over the wafer 32 may be more uniform. After the required semiconductor manufacturing processes have been completed, the wafer 32 may be released from the electrostatic chuck 30 by applying a DC voltage of the opposite polarity, so as to neutralize the electrostatic charge between the wafer 32 and the electrostatic chuck 30. In some embodiments, the released wafer 32 may then be transported by a transfer robot to another fabrication tool, for example.

When repeating the process of holding and releasing the wafer 32 over many times, the warping of the wafer 32 may cause unwanted surface contact with the electrostatic chuck 30, resulting in the attrition of the dimples 33 serving as surface pads of the electrostatic chuck 30. Accordingly, the electrostatic chuck 30 may become unbalanced, and in some instances, the wafer 32 may break in pieces during fabrication as a result. Therefore, in some embodiments, a sensor unit 101 may be added to capture a set of data related to a health status of the electrostatic chuck 30. With reference to FIG. 4A and FIG. 4B, the sensor unit 101 may, for example, capture surface mappings of the electrostatic chuck 30 that depict an attrition level of the dimples 33. For instance, FIG. 4A depicts a sample surface mapping of a new or healthy electrostatic chuck 30, whereas FIG. 4B depicts a sample surface mapping of an abnormal electrostatic chuck 30. It should be noted that, the sensor unit 101 may capture other parameters or data related to the health status of the electrostatic chuck 30, such as the temperature of the heating portion 35, voltage variance, chamber pressure, gas pressure on the wafer 32, and the like, such that a control system of the electrostatic chuck 30 may use the data to diagnose, model and predict the health and lifetime of the electrostatic chuck 30. Moreover, the sensor unit 101 may also include a camera device which may capture aspects of the electrostatic chuck 30 pertinent to its health status. In some embodiments, the camera device may be an area scan camera or a line scan camera, a complementary metal-oxide semiconductor (CMOS) camera, a charge-coupled device (CCD) camera, a video camera, or other suitable types of cameras or sensors that captures the required images of the electrostatic chuck 30. It should be noted that, the position of the sensor unit 101 shown in FIG. 3 is merely for illustrative purposes, as the sensor unit 101 may be placed in any other positions that may facilitate data gathering. Moreover, components of the sensor unit 101 may be integrated with the sensor unit 101, or the components may be part of a standalone package that is coupled to the sensor unit 101.

Figure 5:
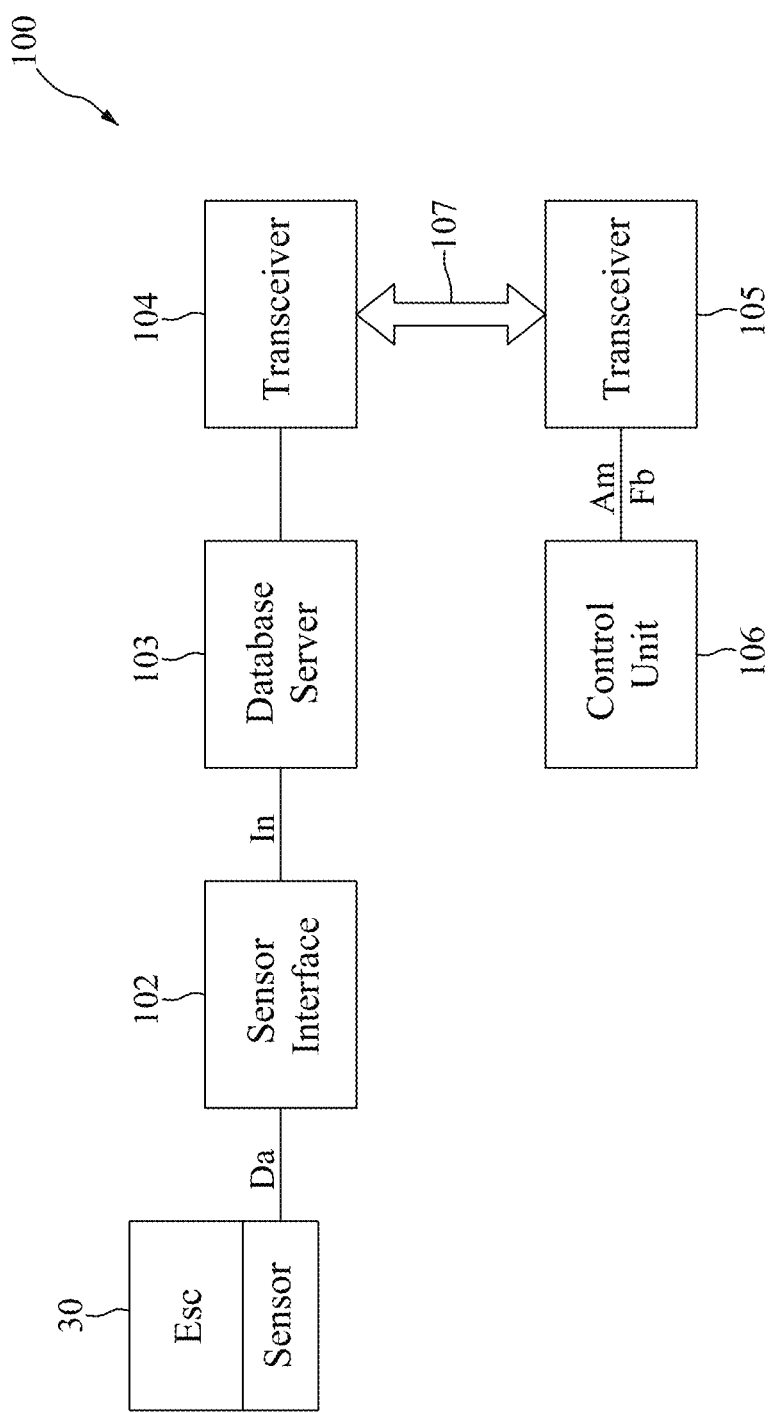
FIG. 5 is a block diagram of a system for controlling a semiconductor manufacturing apparatus according to some embodiments of the present disclosure.
Figure 6:
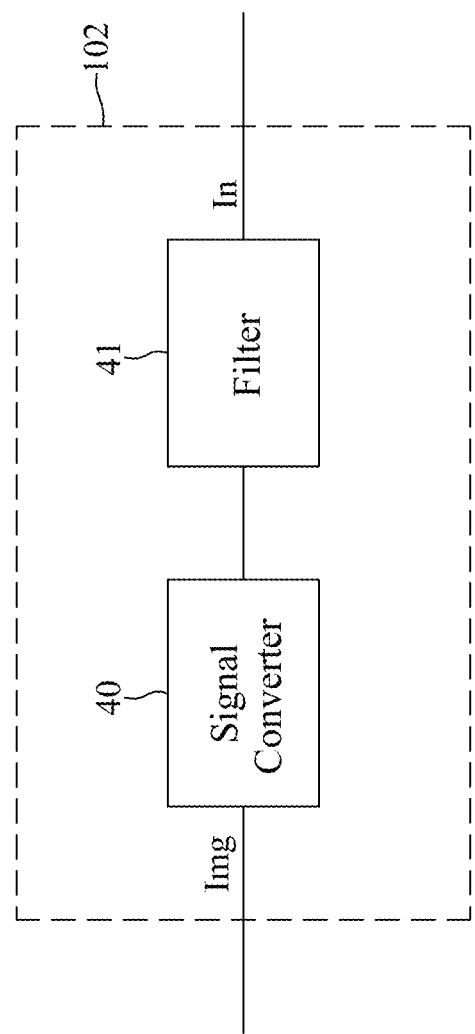
FIG. 6 is a block diagram of a sensor interface according to some embodiments of the present disclosure.
Figure 7:
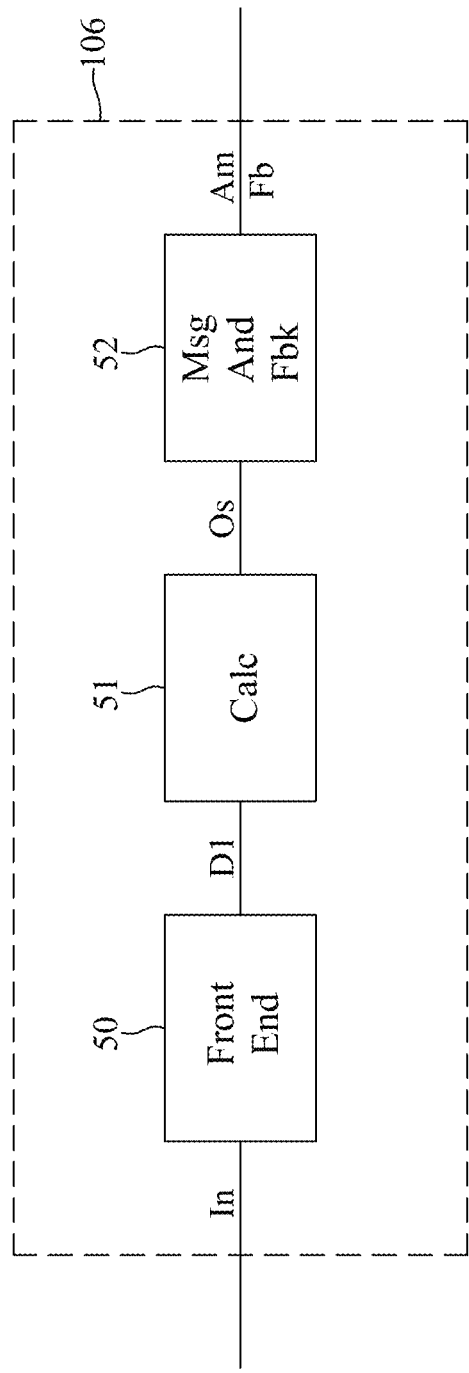
FIG. 7 is a block diagram of a control unit according to some embodiments of the present disclosure.

FIG. 5 is a block diagram of a system 100 for controlling a semiconductor manufacturing apparatus according to some embodiments of the present disclosure. FIG. 6 is a block diagram of a sensor interface 102 according to some embodiments of the present disclosure. FIG. 7 is a block diagram of a control unit 106 according to some embodiments of the present disclosure. With reference to FIG. 5 to FIG. 7, the control system 100 for controlling the electrostatic chuck 30 includes the sensor unit 101, the sensor interface 102, a database server 103, a first transceiver 104, a second transceiver 105, and the control unit 106. In some embodiments, the semiconductor manufacturing apparatus may include, for example, the electrostatic chuck 30 depicted in FIG. 3, although the general operating principles of the system 100 may be applied to other control systems in the control platform 20 of the semiconductor fabrication facility 1. The sensor unit 101 captures a set of data DA related to a health status of the electrostatic chuck 30. In some embodiments, the sensor interface 102 receives the set of data DA from the sensor unit 101 and generates at least one input signal IN for the database server 103, which may be a database server of a database warehouse, for example. The at least one input signal IN may be transmitted from the database server 103 by the first transceiver 104 to the second transceiver 105 through a network link 107. In some embodiments, the at least one input signal IN may be modulated when it is transmitted by the first transceiver 104 and demodulated when it is received by the second transceiver 105. The network link 107 may be any suitable type of network link based on wired or wireless technology known in the art, including but not limited to infrared, optical, or radio communication means. In some embodiments, the control unit 106 performs a health status monitoring process to determine, according to a first data signal D1, whether a malfunction has occurred in the electrostatic chuck 30, and the control unit 106 performs an artificial intelligence (AI) analytical process to model and predict the health and lifetime of the electrostatic chuck 30. A feedback signal FB and an alert signal AM are generated according to an output signal OS. In some embodiments, the feedback signal FB from the control unit 106 is transmitted to the electrostatic chuck 30 through the network link 107 between the second transceiver 105 and the first transceiver 104. In some embodiments, the feedback signal FB may be modulated when it is transmitted by the second transceiver 105 and demodulated when it is received by the first transceiver 104. In some embodiments, the operation of the electrostatic chuck 30 and/or the fabrication tool having the electrostatic chuck 30 may be terminated according to the feedback signal FB.

With reference to FIG. 6, the sensor interface 102 includes one or more signal converters 40 and one or more filters 41. In some embodiments, the signal converters 40 may include image file converters (e.g., image file compression converters), analog-to-digital (A/D) converters, digital-to-analog (D/A) converters, or other suitable signal converters. When generating the input signal IN for the database server 103, the signal converters 40 of the sensor interface 102 may convert the set of data DA to another file format, compress or decompress the set of data DA if required, or perform other suitable types of conversions. The filters 41 may include photography filters, anti-alias filters, low-pass filters, high-pass filters, band-pass filters, or other suitable filters for the particular application of the system 100. The filters 41 may be used to improve the signal to noise ratio of the input signal IN, for instance.

With reference to FIG. 7, the control unit 106 includes a front end subsystem 50, a calculation subsystem 51, and a message and feedback subsystem 52. In some embodiments, the front end subsystem 50 receives the at least one input signal IN from the database server 103 and performs a front end process to generate a first data signal D1. The calculation subsystem 51 receives the first data signal D1 from the front end subsystem 51, and the calculation subsystem 51 performs a health status monitoring process to determine, according to the first data signal D1, whether a malfunction has occurred in the electrostatic chuck 30, and an AI analytical process to model and predict the health and lifetime of the electrostatic chuck 30, and to accordingly generate an output signal OS. The message and feedback subsystem 52 generates the alert signal AM and the feedback signal FB according to the output signal OS, and the message and feedback subsystem 52 transmits the alert signal AM to a user of the electrostatic chuck 30.

Figure 8:
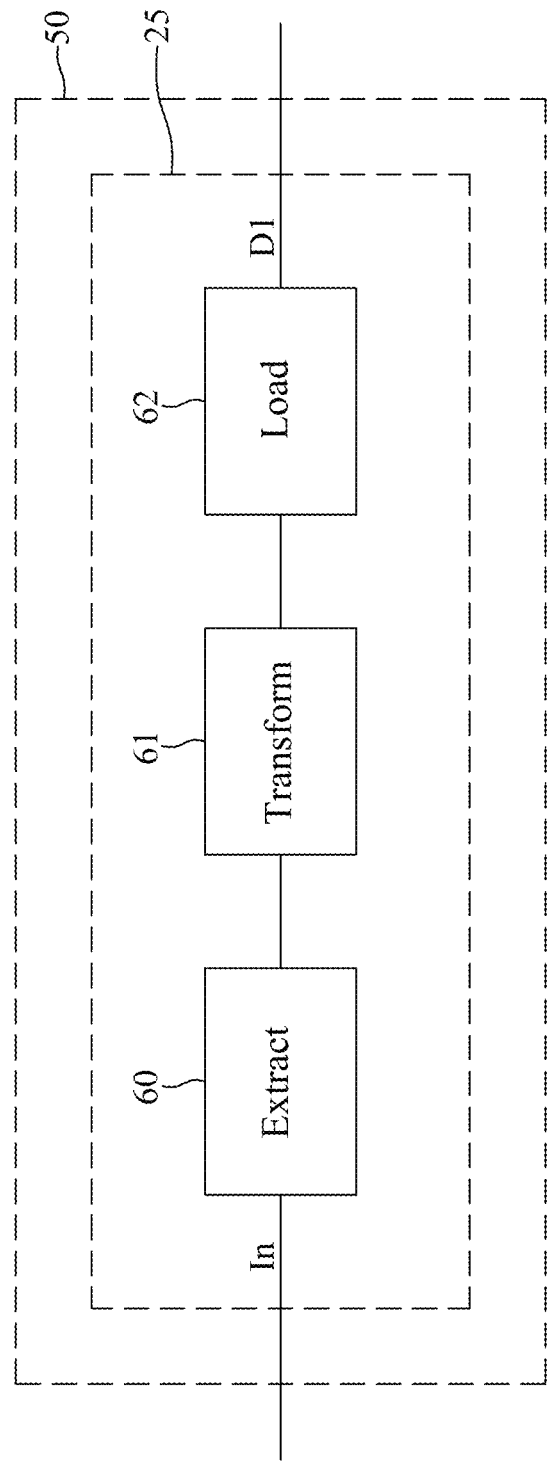
FIG. 8 is a block diagram of the front end subsystem according to some embodiments of the present disclosure.

FIG. 8 is a block diagram of the front end subsystem 50 according to some embodiments of the present disclosure. With reference to FIG. 8, the front end subsystem 50 may include an extract-transform-load (ETL) module 25 for performing the front end process, which may include extracting, transforming, and/or loading the input signal IN from the database server 103. In some embodiments, as shown in FIG. 8, the ETL module 25 includes an extract block 60, a transform block 61, and a load block 62. In some embodiments, the extract block 60 may unpack and extract the at least one input signal IN from the database server 103. The transform block 61 may perform suitable data transformation as well as integrity and confirmation procedures. The load block 62 may generate and load the first data signal D1 according to the transform process performed by the transform block 61, such that the calculation subsystem 51 is able to use the first data signal D1 for the AI analytical process.

Figure 9:
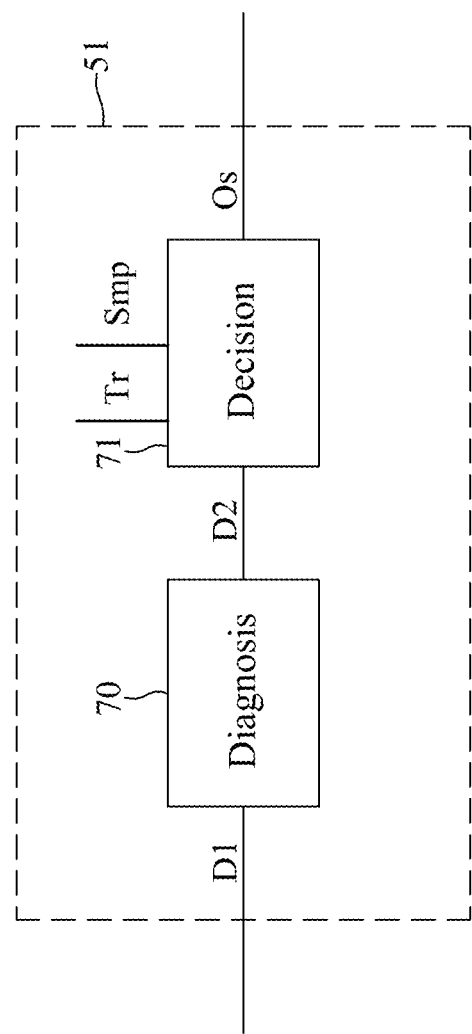
FIG. 9 is a block diagram of the calculation subsystem according to some embodiments of the present disclosure.
Figure 10:
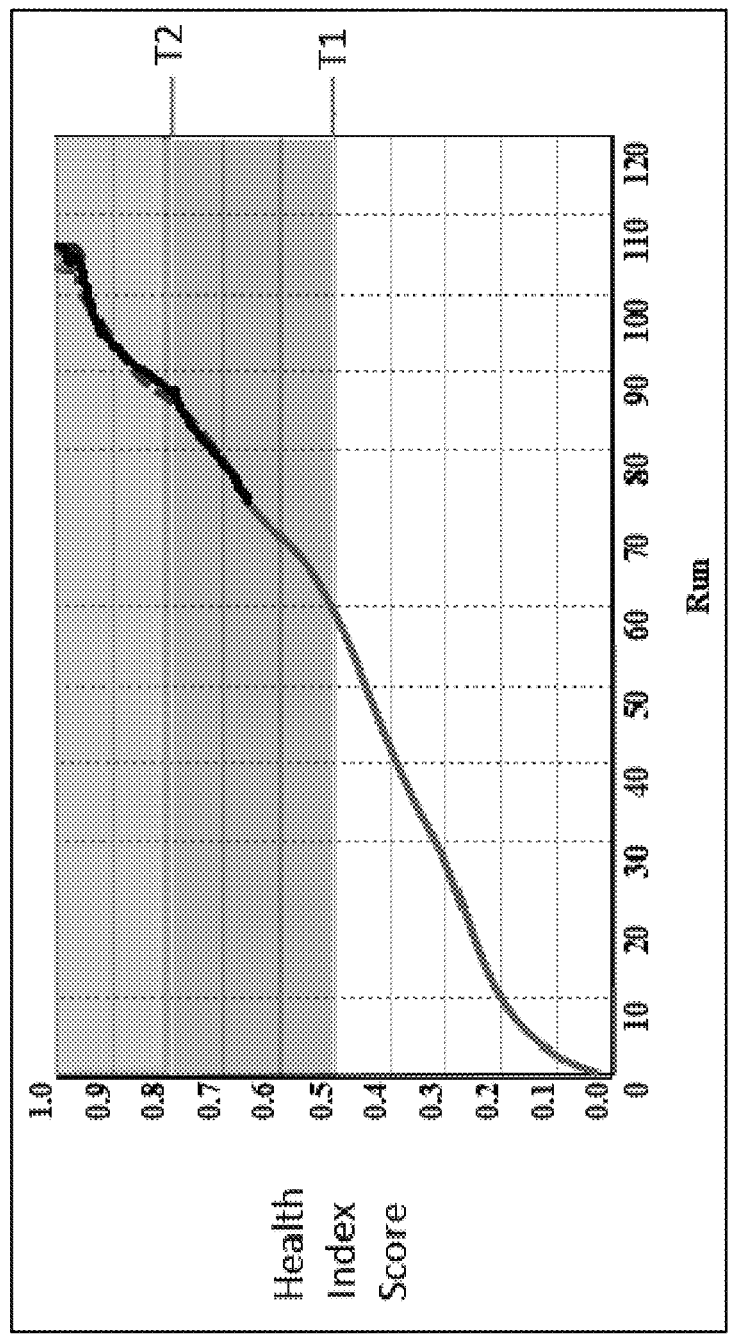
FIG. 10 is a status diagram of a health status monitoring process performed by a diagnosis subsystem according to some embodiments of the present disclosure.
Figure 11:
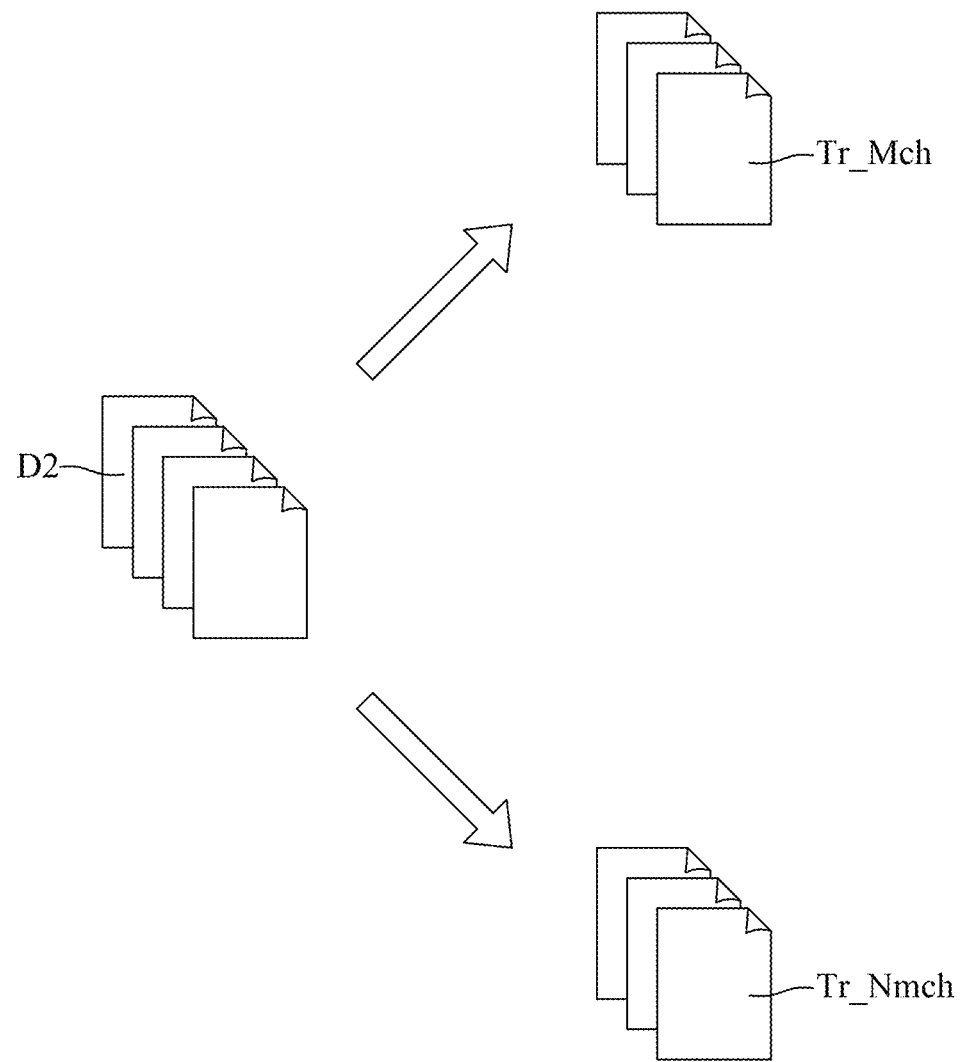
FIG. 11 is a partial schematic view of a categorization procedure in an AI analytical process performed by a decision subsystem according to some embodiments of the present disclosure.

FIG. 9 is a block diagram of the calculation subsystem 51 according to some embodiments of the present disclosure. FIG. 10 is a status diagram of a health status monitoring process performed by a diagnosis subsystem 70 according to some embodiments of the present disclosure. FIG. 11 is a partial schematic view of a categorization procedure in an AI analytical process performed by a decision subsystem 71 according to some embodiments of the present disclosure. With reference to FIG. 9 to FIG. 11, the calculation subsystem 51 includes a diagnosis subsystem 70 and a decision subsystem 71. In some embodiments, the diagnosis subsystem 51 performs the health status monitoring process to determine, according to the first data signal D1, whether a malfunction has occurred in the electrostatic chuck 30 and generates a second data signal D2. The decision subsystem 71 performs the AI analytical process to model and predict the health and remaining lifetime of the electrostatic chuck 30 and generate the output signal OS.

In some embodiments, the status diagram shown in FIG. 10 depicts an index score of the health status of the electrostatic chuck 30 over a number of operational runs. The index score may be gathered from various parameters of the electrostatic chuck 30 included in the first data signal D1, for example. A malfunction may be detected by setting various threshold levels of the index score. For example, in the status diagram shown in FIG. 10, the health status of the electrostatic chuck 30 may be deemed normal below a threshold T1. Between the threshold T1 and a threshold T2, the health status of the electrostatic chuck 30 may be in a warning zone. Moreover, a malfunction is detected above the threshold T2, for example.

In some embodiments, the AI analytical process performed by the decision subsystem 70 monitors and determines one or more trends TR in the second data signal D2 from the diagnosis subsystem 71. In some embodiments, the AI analytical process performed by the decision subsystem 71 further utilizes a statistical model prediction SMP to obtain an apparatus lifetime prediction score of the electrostatic chuck 30 corresponding to the set of data DA related to the health status in the first data signal D1. As shown in FIG. 11, the statistical model prediction SMP utilized by the decision subsystem 71 of the calculation subsystem 51 may identify and categorize the second data signal D2 into a matching trend group TR_MCH and a non-matching trend group TR_NMCH. It should be noted that, the statistical model prediction SMP may be a deep learning model based on neural networks or pseudo-neural networks, for example, although other suitable models may be used.

Figure 12:
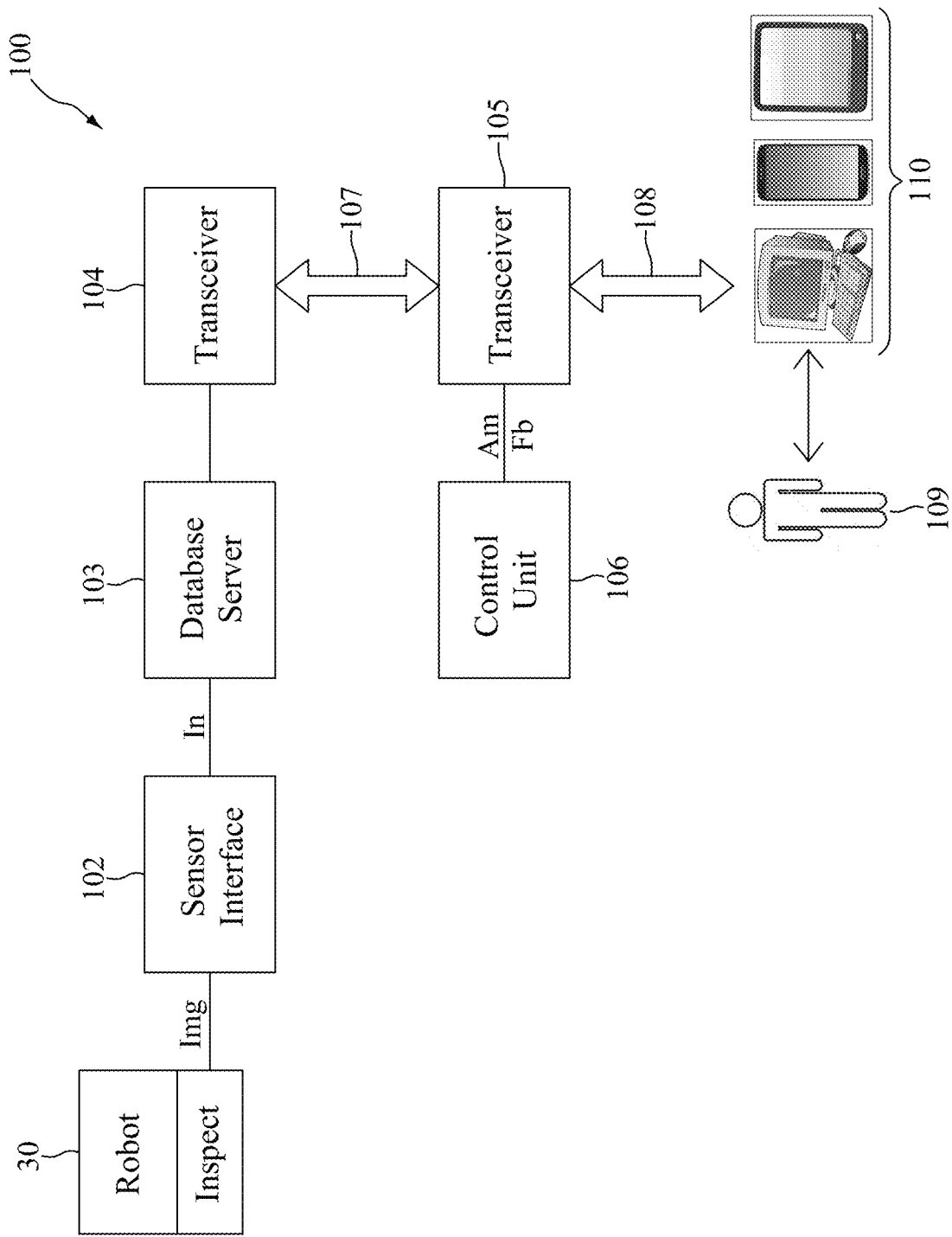
FIG. 12 is a sample chart containing the likelihood score of the transfer robot according to some embodiments of the present disclosure.
Figure 13:
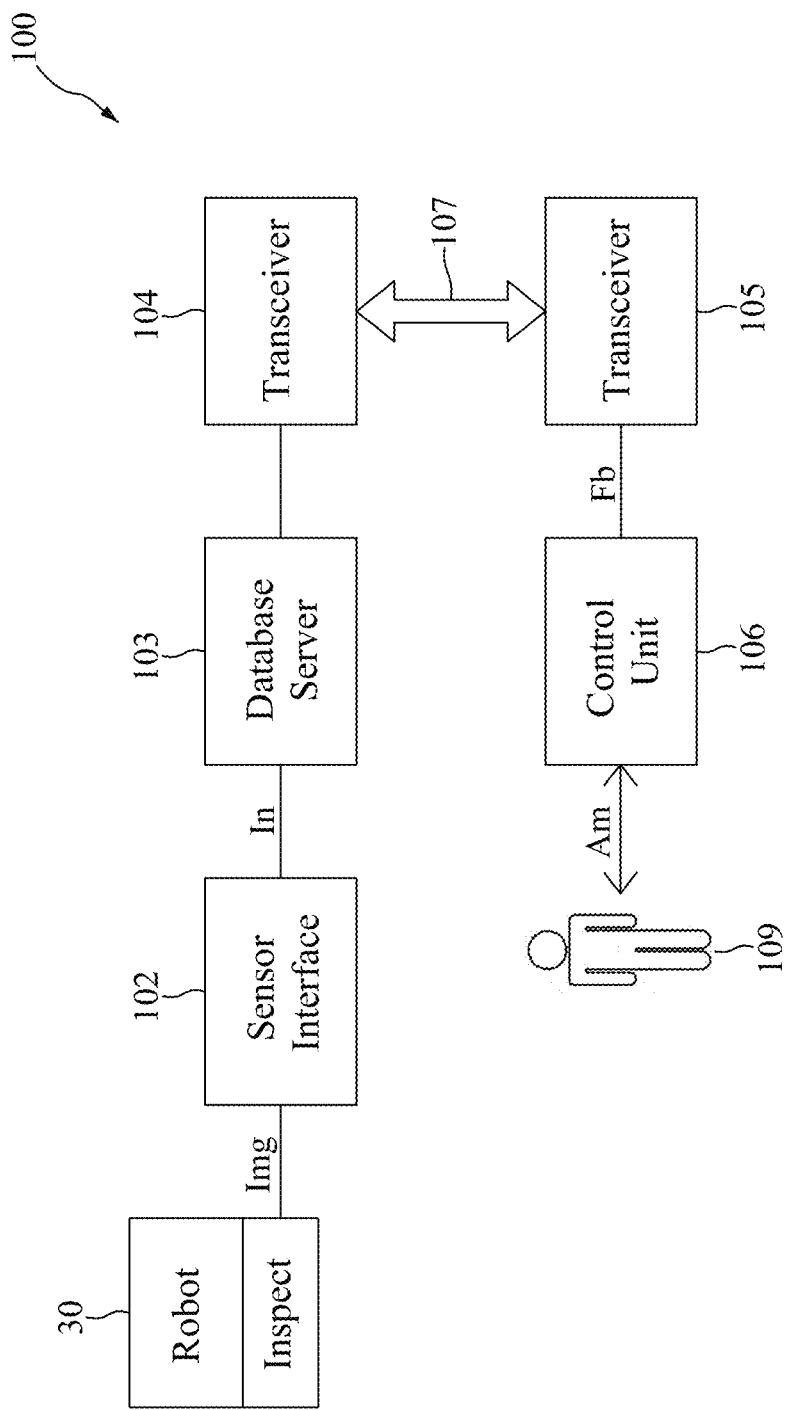
FIG. 13 is a block diagram depicting the control system of the semiconductor manufacturing apparatus and a user thereof according to some embodiments of the present disclosure.
Figure 14A:
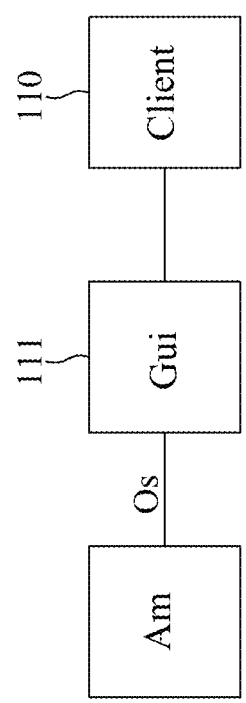
FIG. 14A is a relational diagram showing a relationship between an alert signal AM and components thereof according to some embodiments of the present disclosure.
Figure 14B:
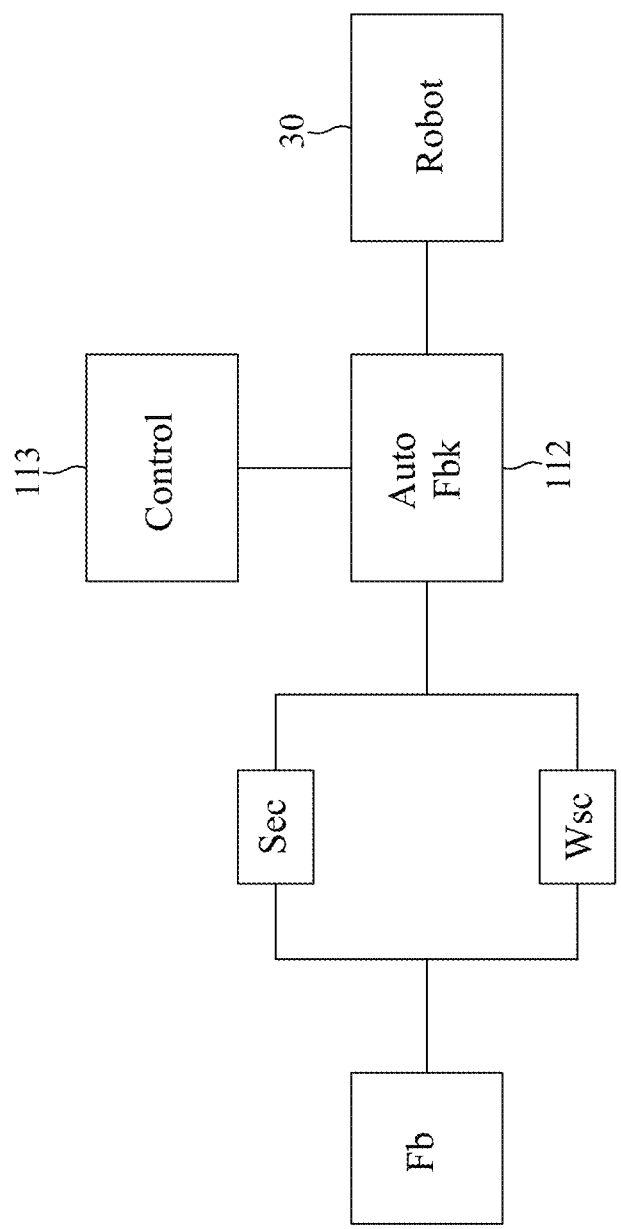
FIG. 14B is a relational diagram showing a relationship between a feedback signal FB and components thereof according to some embodiments of the present disclosure.

In some embodiments, the message and feedback subsystem 52 generates the alert signal AM according to the output signal OS from the calculation subsystem 51. In some embodiments, the alert signal AM may be sent to a user of the electrostatic chuck 30. FIG. 12 and FIG. 13 are block diagrams depicting the control system 100 of the semiconductor manufacturing apparatus and a user thereof according to some embodiments of the present disclosure. FIG. 14A is a relational diagram showing a relationship between an alert signal AM and components thereof according to some embodiments of the present disclosure. FIG. 14B is a relational diagram showing a relationship between a feedback signal FB and components thereof according to some embodiments of the present disclosure. With reference to FIGS. 12 and 13, in some embodiments, the message and feedback subsystem 52 may transmit the alert signal AM to the user 109 through a network link 108 established between the second transceiver 105 and a client system 110. As shown in FIG. 12, the client system 110 may be, for example, a desktop computer, a notebook computer, a smart phone, a tablet computer, or the like capable of displaying the alert signal AM to the user 108. With reference to FIG. 14A, the contents of the alert signal AM, which may include data included in the output signal OS, may be presented in a graphical user interface (GUI) 111 on the client system 110. The network link 108 may be any suitable type of network link based on wired or wireless technology known in the art, including but not limited to infrared, optical, or radio communication means. The alert signal AM may be transmitted to the client system 110 via electronic mail, instant messaging applications, or the like. The network links 107 and 108 may be part of a same network or different networks. The network links 107 and 108 may be part of an intranet, an extranet, an ad hoc network, a virtual private network (VPN), a local area network (LAN), a wireless LAN (WLAN), a wireless WAN (WWAN), a wide area network (WAN), a metropolitan area network (MAN), a portion of the Internet, a portion of the Public Switched Telephone Network (PSTN), a cellular telephone network, or a combination of two or more of these. In some embodiments, as shown in FIG. 13, the alert signal AM may also be directly supplied and displayed by the control unit 106 to the user 109. In some embodiments, the alert signal AM gives the user 109 advanced warnings regarding the status of the electrostatic chuck 30, such as which robots has the highest likelihood of deviating from the predetermined path 36, and whether automated feedback processes are scheduled.

With reference to FIG. 14B, in some embodiments, when the feedback signal FB is transmitted to the electrostatic chuck 30 for an automated feedback process 112, the electrostatic chuck 30 is automatically adjusted or shutdown according to the output signal OS. For instance, the feedback signal FB may include a stop apparatus command SEC, and/or a wafer scrap command WSC according to the output signal OS. In some embodiments, the feedback signal FB may also include other commands such as alignment adjustment commands, power adjustment commands, or other process feedback commands. In some embodiments, the electrostatic chuck 30 may be automatically adjusted or shutdown run-to-run with reference to the feedback signal FB. It should be noted that, the feedback signal FB may be used directly by the electrostatic chuck 30 for the automated feedback process 112, or the feedback signal FB may be transmitted to a separate controller 113 to control the automated tuning process 112 of the electrostatic chuck 30.

Figure 15:
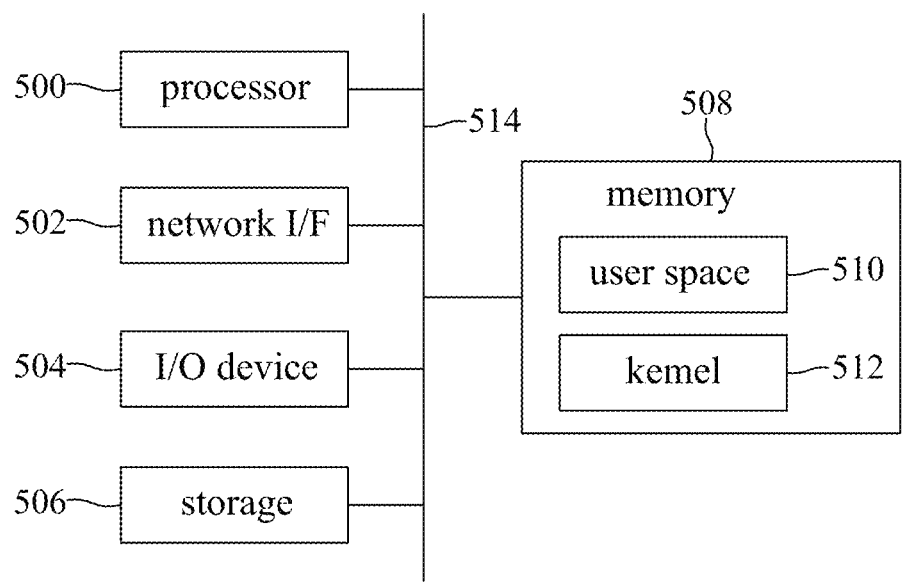
FIG. 15 is a block diagram of a computer system according to some embodiments of the present disclosure.

It should be noted that one or more of the tools, subsystems, methods, or operations described in the present disclosure may be realized by a computer system including instructions operable when executed by one or more processors of the computer system. For example, the control unit 106 and a method 600 described later in the present disclosure may be implemented by a computer system depicted in FIG. 15. FIG. 15 is a block diagram of a computer system 80 according to some embodiments of the present disclosure. With reference to FIG. 15, the computer system 80 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, for example, the kernel 512, the user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/removable or internal/built-in storage or memory unit, e.g., one or more of an optical disk, such as a DVD, a magnetic disk, such as a hard disk, a semiconductor memory, such as a ROM, a RAM, a memory card, and the like. In some embodiments, the computer-readable non-transitory storage media of the storage device 506 includes instructions operable when executed by the one or more processors 500 to cause the control system 100 to receive the at least one input signal IN from the database server 103 and perform the front end process to generate the data signal DS; perform the AI analytical process to determine, according to the data signal DS, whether a malfunction 30MF has occurred in the semiconductor manufacturing apparatus and to generate the output signal OS; and generate the alert signal AM and the feedback signal FB according to the output signal OS, and transmit the alert signal AM to the user 109 of the semiconductor manufacturing apparatus. In some embodiments, the front end process includes extracting, transforming, and/or loading the input signal IN from the database server 103. In some embodiments, the one or more computer-readable non-transitory storage media further includes instructions operable when executed by the one or more processors 500 to cause the control system 100 to perform the AI analytical process by comparing the transport path 35' of the semiconductor manufacturing apparatus to the predetermined path 36'. In some embodiments, the one or more computer-readable non-transitory storage media further includes instructions operable when executed by the one or more processors 500 to cause the control system 100 to perform the AI analytical process by further utilizing an object tracking algorithm to track the semiconductor manufacturing apparatus and identify one or more images IMG in the data signal DS in which the transport path 35' of the semiconductor manufacturing apparatus deviates from the predetermined path 36'. In some embodiments, the one or more computer-readable non-transitory storage media further includes instructions operable when executed by the one or more processors 500 to cause the control system 100 to perform the AI analytical process by further utilizing the statistical model prediction SMP to obtain the likelihood score LS of the semiconductor manufacturing apparatus corresponding to the images IMG of the data signal DS. In some embodiments, the one or more computer-readable non-transitory storage media further includes instructions operable when executed by the one or more processors 500 to cause the control system 100 to transmit the feedback signal FB for an automated feedback process of the semiconductor manufacturing apparatus according to the output signal OS. In some embodiments, the semiconductor manufacturing apparatus includes one or more transfer robots 30.

In some embodiments, the I/O device 604 includes an input device, an output device, or a combined input/output device for enabling user interaction with the control unit 106. An input device includes, for example, a keyboard, keypad, mouse, trackball, trackpad, or cursor direction keys for communicating information and commands to the processor 500. An output device includes, for example, a display, a printer, a voice synthesizer, etc. for communicating information to a user. In some embodiments, one or more operations or functionalities of the tools, subsystems, and methods described in the present disclosure are realized by the one or more processors 500 of the computer system 80, which is programmed for performing such operations and functionalities. One or more of the memory 508, the network I/F 502, the storage device 506, the I/O device 504, and the bus 514 are operable to receive instructions, data, design rules, netlists, layouts, models and other parameters for processing by the processor 500. In some embodiments, one or more of the operations and functionalities of the tools, subsystems, and methods described in the present disclosure may be implemented by specifically configured hardware (e.g., by one or more application specific integrated circuits (ASICs)) separate from or in lieu of the processor 500. Some embodiments incorporate more than one of the described operations or functionality in a single ASIC.

Figure 16:
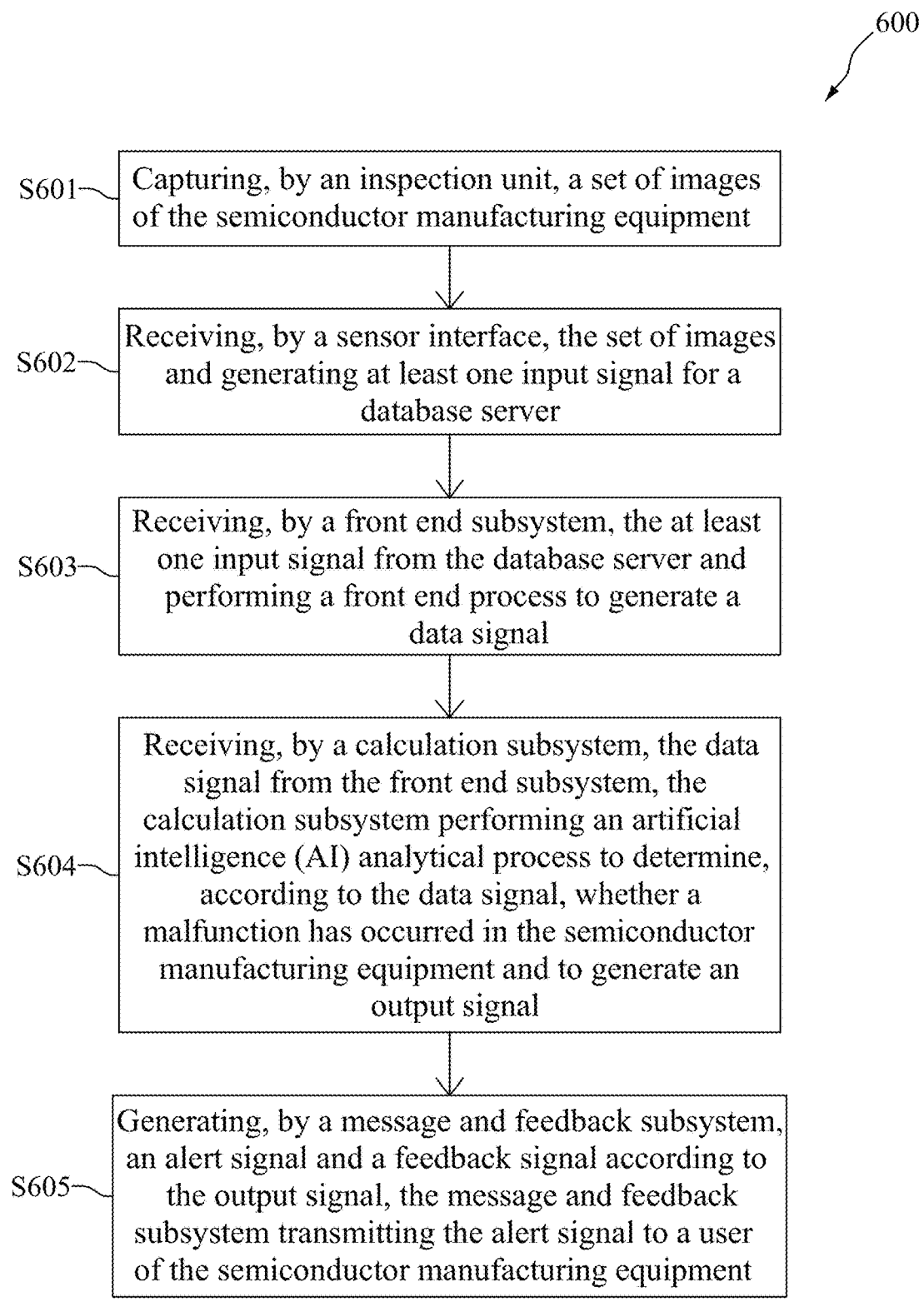
FIG. 16 is a flow diagram of a method for controlling a semiconductor manufacturing apparatus according to some embodiments of the present disclosure.

FIG. 16 is a flow diagram of a method 600 for controlling a semiconductor manufacturing apparatus according to some embodiments of the present disclosure. In some embodiments, the method 600 may be implemented by the control system 100 depicted in FIG. 5 to FIG. 9, and the method 600 may also be realized by the computer system 80 depicted in FIG. 15. With reference to FIG. 16, the method 600 for controlling the semiconductor manufacturing apparatus includes: capturing, by the inspection unit 101, a set of images IMG of the semiconductor manufacturing apparatus (Step S601); receiving, by the sensor interface 102, the set of images IMG and generating the at least one input IN signal for the database server 103 (Step S602); receiving, by the front end subsystem 50, the at least one input signal IN from the database server 103 and performing the front end process to generate the data signal DS (Step S603); receiving, by the calculation subsystem 51, the data signal DS from the front end subsystem 50, the calculation subsystem 51 performing the artificial intelligence (AI) analytical process to determine, according to the data signal DS, whether a malfunction 30MF has occurred in the semiconductor manufacturing apparatus and generating the output signal OS (Step S604); and generating, by the message and feedback subsystem 52, the alert signal AM and the feedback signal FB according to the output signal OS, the message and feedback subsystem 52 transmitting the alert signal AM to the user 109 of the semiconductor manufacturing apparatus (Step S605).

Figure 17:
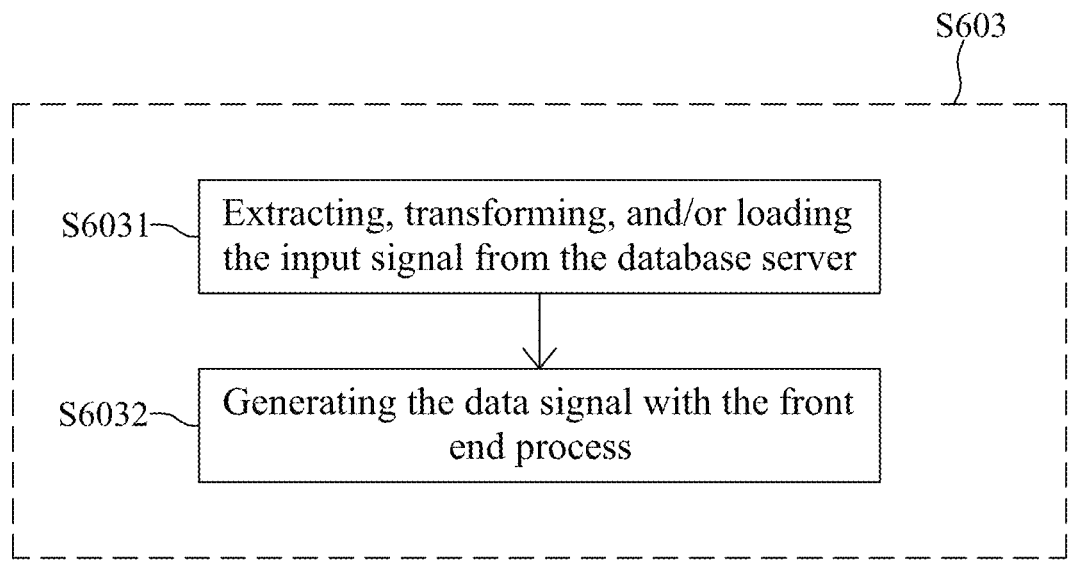
FIG. 17 is a flow diagram of a step in a method for controlling a semiconductor manufacturing apparatus according to some embodiments of the present disclosure.

FIG. 17 is a flow diagram of the Step S603 in the method 600 according to some embodiments of the disclosure. In some embodiments, the front end process performed by the front end subsystem 50 further includes extracting, transforming, and/or loading the input signal IN from the database server 103 (Step S6031); and generating the data signal DS with the front end process (Step S6032).

Figure 18:
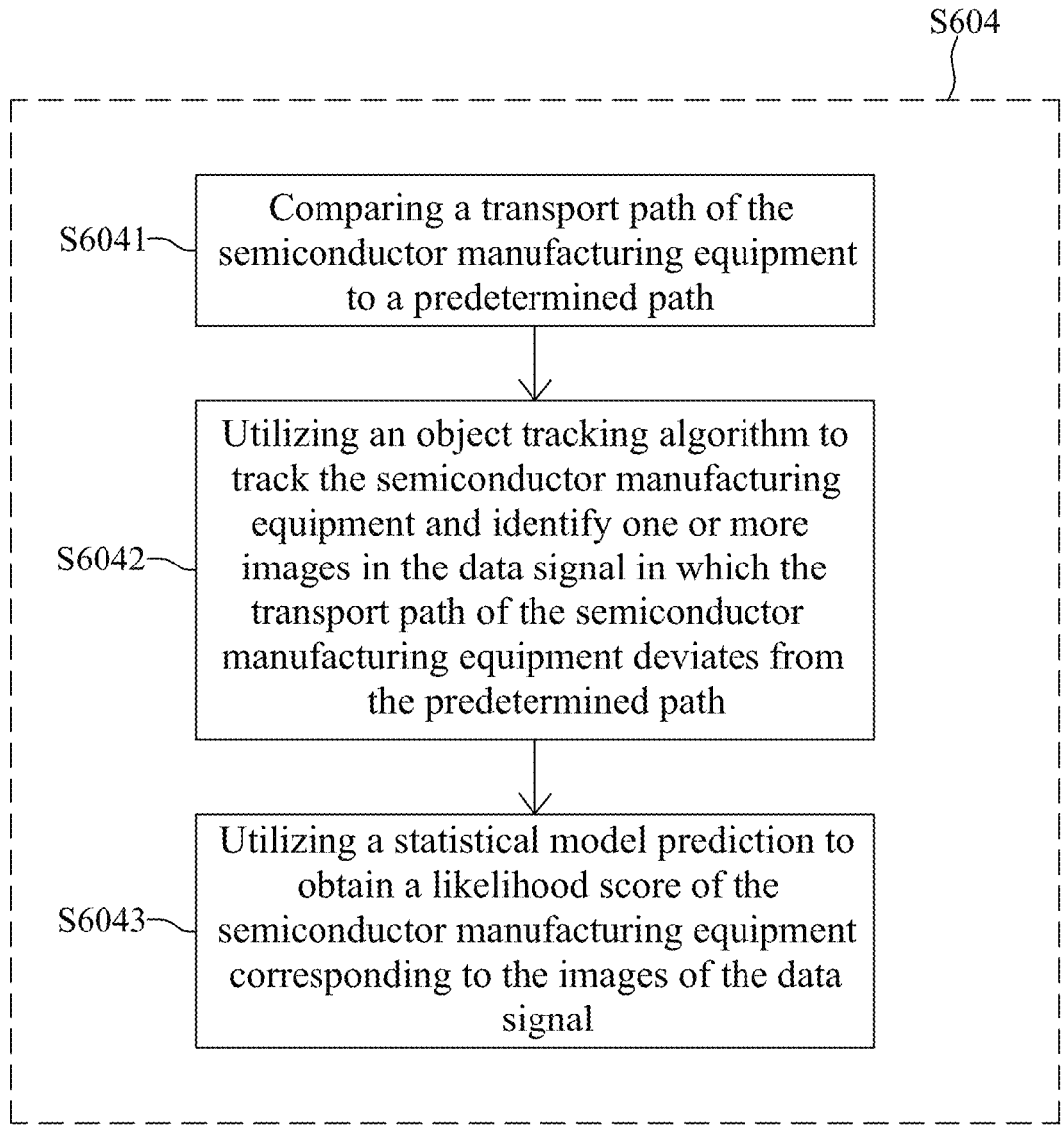
FIG. 18 is a flow diagram of a step in a method for controlling a semiconductor manufacturing apparatus according to some embodiments of the present disclosure.

FIG. 18 is a flow diagram of the Step S604 in the method 600 according to some embodiments of the disclosure. In some embodiments, the AI analytical process performed by the calculation subsystem 51 further includes comparing the transport path 35' of the semiconductor manufacturing apparatus to the predetermined path 36' (Step S6041). In some embodiments, the AI analytical process performed by the calculation subsystem 51 further includes utilizing the object tracking algorithm to track the semiconductor manufacturing apparatus and identify one or more images IMG in the data signal DS in which the transport path 35' of the semiconductor manufacturing apparatus deviates from the predetermined path 36' (Step S6042). In some embodiments, the AI analytical process performed by the calculation subsystem 51 further includes utilizing the statistical model prediction SMP to obtain the likelihood score LS of the semiconductor manufacturing apparatus corresponding to the images IMG of the data signal DS (Step S6043).

Figure 19:
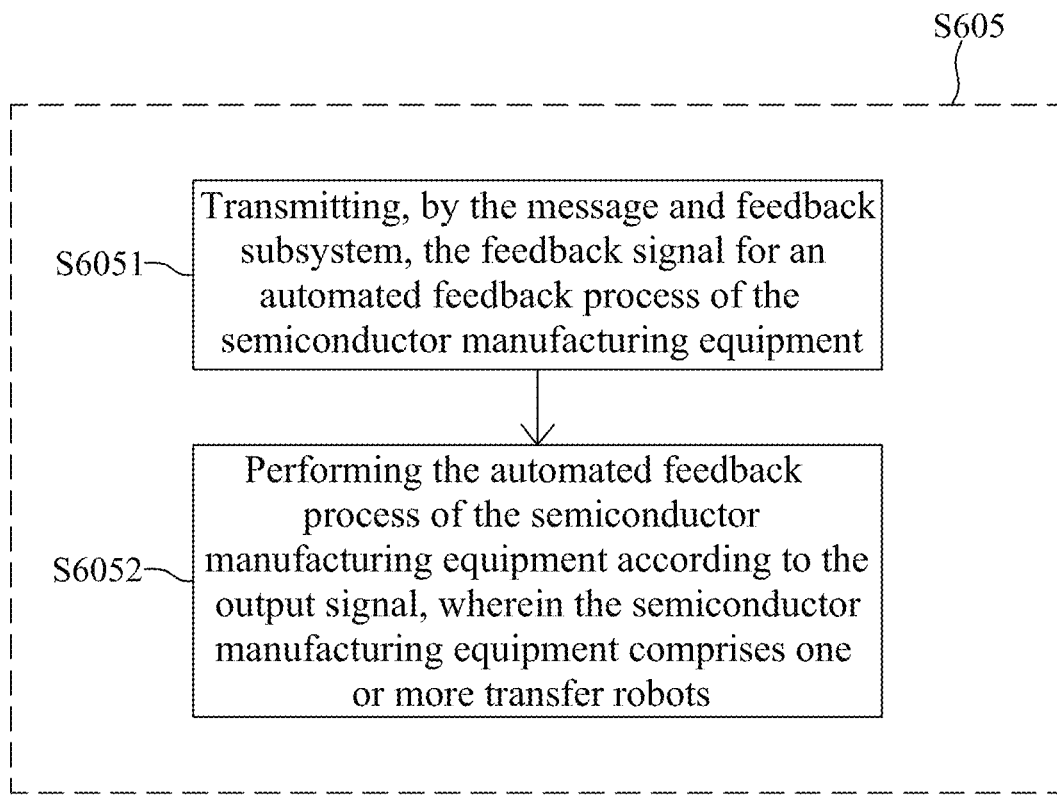
FIG. 19 is a flow diagram of a step in a method for controlling a semiconductor manufacturing apparatus according to some embodiments of the present disclosure.

FIG. 19 is a flow diagram of the Step S605 in the method 600 according to some embodiments of the disclosure. In some embodiments, the method 600 further includes transmitting, by the message and feedback subsystem 52, the feedback signal FB for the automated feedback process 112 of the semiconductor manufacturing apparatus (Step S6051); and performing the automated feedback process 112 according to the output signal OS, in which the semiconductor manufacturing apparatus includes one or more transfer robots 30 (Step S6052).

Accordingly, the control system 100 and the method 600 for controlling semiconductor manufacturing apparatus provide automated AI subsystems and processes capable of analyzing apparatus such as the electrostatic chuck 30 that may be deviating from a predetermined path. Due to the control unit 106, which includes the intelligent calculation subsystem 51 and the message and feedback subsystem 52, operators of the electrostatic chuck 30 can monitor and optimize the process parameters and receive advanced warnings regarding malfunctioning apparatus. Moreover, due to the automated apparatus feedback of the control system 100 and the method 600, human judgment error, processing times, and the quantity of defective products can be minimized.

One aspect of the present disclosure provides a control system of a semiconductor manufacturing apparatus, comprising an inspection unit capturing a set of images of the semiconductor manufacturing apparatus, a sensor interface receiving the set of images and generating at least one input signal for a database server, and a control unit. The control unit comprises a front end subsystem, a calculation subsystem, and a message and feedback subsystem. The front end subsystem receives the at least one input signal from the database server and performs a front end process to generate a data signal. The calculation subsystem receives the data signal from the front end subsystem, wherein the calculation subsystem performs an artificial intelligence (AI) analytical process to determine, according to the data signal, whether a malfunction has occurred in the semiconductor manufacturing apparatus and to generate an output signal. The message and feedback subsystem generates an alert signal and a feedback signal according to the output signal, the message and feedback subsystem transmitting the alert signal to a user of the semiconductor manufacturing apparatus.

Another aspect of the present disclosure provides a control system of a semiconductor manufacturing apparatus comprising an inspection unit capturing a set of images of the semiconductor manufacturing apparatus, a sensor interface receiving the set of images and generating at least one input signal for a database server, one or more processors, and one or more computer-readable non-transitory storage media. The one or more computer-readable non-transitory storage media is coupled to the one or more processors and includes instructions operable when executed by the one or more processors to cause the control system to: receive the at least one input signal from the database server and perform a front end process to generate a data signal; perform an artificial intelligence (AI) analytical process to determine, according to the data signal, whether a malfunction has occurred in the semiconductor manufacturing apparatus and to generate an output signal; and generate an alert signal and a feedback signal according to the output signal, and transmit the alert signal to a user of the semiconductor manufacturing apparatus.

Another aspect of the present disclosure provides a method for controlling a semiconductor manufacturing apparatus comprising: capturing, by an inspection unit, a set of images of the semiconductor manufacturing apparatus; receiving, by a sensor interface, the set of images and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether a malfunction has occurred in the semiconductor manufacturing apparatus and to generate an output signal; and generating, by a message and feedback subsystem, an alert signal and a feedback signal according to the output signal, the message and feedback subsystem transmitting the alert signal to a user of the semiconductor manufacturing apparatus.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A system for controlling a semiconductor manufacturing apparatus, comprising:
    a sensor unit capturing a set of data related to a health status of the semiconductor manufacturing apparatus;
    a sensor interface receiving the set of data and generating at least one input signal for a database server; and
    a control unit comprising:
        a front end subsystem receiving the at least one input signal from the database server and performing a front end process to generate a first data signal;
        a diagnosis subsystem receiving the first data signal from the front end subsystem, the diagnosis subsystem performing a health status monitoring process to determine whether a malfunction has occurred in the semiconductor manufacturing apparatus and to generate a second data signal;
        a decision subsystem performing an artificial intelligence (AI) analytical process to generate an output signal according to the second data signal from the diagnosis subsystem, wherein the AI analytical process performed by the decision subsystem utilizes a statistical model prediction including a deep learning model to obtain an apparatus lifetime prediction score of the semiconductor manufacturing apparatus corresponding to set of data related to the health status in the first data signal; wherein the statistical model prediction utilized by the decision subsystem identifies and categorizes the second data signal into a matching trend group and a non-matching trend group; and
        a message and feedback subsystem generating an alert signal and a feedback signal according to the output signal, the message and feedback subsystem transmitting the alert signal to a user of the semiconductor manufacturing apparatus.

2. The system of claim 1, wherein the front end process performed by the front end subsystem comprises extracting, transforming, and/or loading the input signal from the database server.

3. The system of claim 1, wherein the AI analytical process performed by the decision subsystem monitors and determines one or more trends in the second data signal from the diagnosis subsystem.

4. The system of claim 1, wherein the message and feedback subsystem transmits the feedback signal for an automated feedback process of the semiconductor manufacturing apparatus according to the output signal.

5. The system of claim 1, wherein the alert signal comprises an apparatus health score alert, an apparatus lifetime prediction alert, and a malfunction component alert generated according to the output signal, wherein the apparatus lifetime prediction alert comprises a predicted remaining life value of the semiconductor manufacturing apparatus.

6. The system of claim 1, wherein the semiconductor manufacturing apparatus comprises one or more electrostatic chucks.

7. A system for controlling a semiconductor manufacturing apparatus comprising:
    a sensor unit capturing a set of data related to a health status of the semiconductor manufacturing apparatus;
    a sensor interface receiving the set of data and generating at least one input signal or a database server;
    one or more processors; and
    one or more computer-readable non-transitory storage media coupled to the one or more processors and comprising instructions operable when executed by the one or more processors to cause the control system to:
        receive the at least one input signal from the database server and performing a front end process to generate a first data signal;
        perform a health status monitoring process to determine whether a malfunction has occurred in the semiconductor apparatus and to generate a second data signal;
        perform an artificial intelligence (AI) analytical process to generate an output signal according to the second data signal;
        perform the AI analytical process by further utilizing a statistical model prediction including a deep learning model to obtain an apparatus lifetime prediction score of the semiconductor manufacturing apparatus corresponding to the set of data related to the health status in the first data signal;
        identifying and categorizing, with the statistical model prediction, the second data signal into a matching trend group and a non-matching trend group; and
        generate an alert signal and a feedback signal according to the output signal, and transmit the alert signal to a user of the semiconductor manufacturing apparatus.

8. The system of claim 7, wherein the front end process comprises extracting, transforming, and/or loading the input signal from the database server.

9. The system of claim 7, the one or more computer-readable non-transitory storage media further comprising instructions operable when executed by the one or more processors to cause the system to perform the AI analytical process by monitoring and determining one or more trends in the second data signal.

10. The system of claim 7, the one or more computer-readable non-transitory storage media further comprising instructions operable when executed by the one or more processors to cause the system to transmit the feedback signal for an automated feedback process of the semiconductor manufacturing apparatus according to the output signal.

11. The system of claim 7, wherein the alert signal comprises an apparatus health score alert, an apparatus lifetime prediction alert, and a malfunction component alert generated according to the output signal, wherein the apparatus lifetime prediction alert comprises a predicted remaining life value of the semiconductor manufacturing apparatus.

12. The system of claim 7, wherein the semiconductor manufacturing apparatus comprises one or more electrostatic chucks.

13. A method for controlling a semiconductor manufacturing apparatus comprising:
    capturing, by a sensor unit, a set of data related to a health status of the semiconductor manufacturing apparatus;
    receiving, by a sensor interface the set of data and generating at least one input signal for a database server;

receiving, by a front end subsystem, the at least one input signal from the database server and performing a front end process to generate a first data signal;

receiving, by a diagnosis subsystem, the first data signal from the front end subsystem and performing a health status monitoring process to determine whether a malfunction has occurred in the semiconductor manufacturing apparatus and to generate a second data signal;

performing, by a decision subsystem, an artificial intelligence (AI) analytical process to generate an output signal according to the second data signal from the diagnosis subsystem;

performing, by the decision subsystem, the AI analytical process to utilize a statistical model prediction including a deep learning model to obtain an apparatus lifetime prediction score of the semiconductor manufacturing apparatus corresponding to the set of data related to the health status in the first data signal;

identifying and categorizing, with the statistical model prediction, the second data signal into a matching trend group and a non-matching trend group; and generating, by a message and feedback subsystem, an alert signal and a feedback signal according to the output signal and transmitting the alert signal to a user of the semiconductor manufacturing apparatus.

14. The method of claim 13, the front end process performed by the front end subsystem further comprising extracting, transforming, and/or loading the input signal from the database server.

15. The method of claim 13, the AI analytical process performed by the decision subsystem further comprising monitoring and determining one or more trends in the second data signal from the diagnosis subsystem.

16. The method of claim 13, further comprising transmitting, by the message and feedback subsystem, the feedback signal for an automated feedback process of the semiconductor manufacturing apparatus according to the output signal.

17. The method of claim 13, wherein the alert signal comprises an apparatus health score alert, an apparatus lifetime prediction alert, and a malfunction component alert generated according to the output signal, the apparatus lifetime prediction alert comprising a predicted remaining life value of the semiconductor manufacturing apparatus, and wherein the semiconductor manufacturing apparatus comprises one or more transfer robots.

* * * * *